(12) United States Patent
Durston et al.

(10) Patent No.: US 10,330,719 B2
(45) Date of Patent: Jun. 25, 2019

(54) PICKOFF TRANSDUCER WIRE BOND BIT DETECTION

(71) Applicant: Silicon Sensing Systems Limited, Plymouth, Devon (GB)

(72) Inventors: Michael Terence Durston, Plymouth (GB); Douglas Robert Sitch, Plymouth (GB)

(73) Assignee: SILICON SENSING SYSTEMS LIMITED, Plymouth, Devon (GB)

( * ) Notice: Subject to any disclaimer, the term of this patent is extended or adjusted under 35 U.S.C. 154(b) by 19 days.

(21) Appl. No.: 14/901,434

(22) PCT Filed: Jul. 3, 2014

(86) PCT No.: PCT/EP2014/064239
§ 371 (c)(1),
(2) Date: Dec. 28, 2015

(87) PCT Pub. No.: WO2015/001044
PCT Pub. Date: Jan. 8, 2015

(65) Prior Publication Data
US 2016/0370417 A1   Dec. 22, 2016

(30) Foreign Application Priority Data

Jul. 4, 2013 (GB) .................................. 1311967.2

(51) Int. Cl.
*G01R 31/00* (2006.01)
*G01R 31/04* (2006.01)
(Continued)

(52) U.S. Cl.
CPC ......... *G01R 31/04* (2013.01); *G01C 19/5776* (2013.01); *G01D 18/00* (2013.01)

(58) Field of Classification Search
USPC ..................... 324/511, 500, 509; 73/504.12
See application file for complete search history.

(56) References Cited

U.S. PATENT DOCUMENTS 5,495,414 A    2/1996  Spangler
2002/0117895 A1   8/2002  Kemp et al.
(Continued)

FOREIGN PATENT DOCUMENTS

EP    3017276 A1   5/2016
GB    1388239 A    3/1975
(Continued)

OTHER PUBLICATIONS

Baschirotto A et al: "Interface for MEMS-based rotational accelerometer for HDD applications with 2.5 rad/s<2> resolution and digital output", IEEE Sensors Journal, vol. 3, No. 4, Aug. 1, 2003, pp. 383-392, 10 pages.
Lemkin M et al: "A Three-Axis Micromachined Accelerometer With a CMOS P0siti0n-Senseinterfacr and Digital Offset-Trim Electronics", IEEE Journal of Solid-State Circuits, vol. 34, No. 4, Apr. 1, 1999, pp. 456-468, 13 pages.
(Continued)

*Primary Examiner* — Vincent Q Nguyen
(74) *Attorney, Agent, or Firm* — Cantor Colburn LLP

(57) ABSTRACT

A sensor device includes at least two transducers, a sensor signal processing circuit, and a transducer to sensor signal processing circuit electrical connections, each connecting a respective one of the transducers to the sensor signal processing circuit. The device also includes a differential amplifier connected with two bond wires, the bond wires connected to the differential inputs of the differential amplifier and the amplifier output connected to the sensor signal processing circuit.

1 Claim, 3 Drawing Sheets

(51) Int. Cl.
*G01C 19/5776* (2012.01)
*G01D 18/00* (2006.01)

(56) References Cited

U.S. PATENT DOCUMENTS

| | | | |
|---|---|---|---|
| 2006/0097726 A1 | 5/2006 | Frederick | |
| 2008/0211512 A1 | 9/2008 | Czech | |
| 2009/0091306 A1 | 4/2009 | Hojo | |
| 2010/0045328 A1 | 2/2010 | Suto | |
| 2013/0015919 A1* | 1/2013 | Kropfitsch | H03F 1/38 330/260 |
| 2013/0031950 A1 | 2/2013 | Donadel | |
| 2014/0338449 A1* | 11/2014 | Durston | G01C 19/5684 73/504.12 |

FOREIGN PATENT DOCUMENTS

| | | |
|---|---|---|
| JP | 2009025044 A | 2/2009 |
| WO | 2007133980 A2 | 11/2007 |
| WO | 2013079925 A1 | 6/2013 |
| WO | 2015001044 A1 | 1/2015 |

OTHER PUBLICATIONS

Notification of Transmittal of the International Search Report and the Written Opinion of the International Searching Authority, or the Declaration; PCT/EP2014/064239; dated Oct. 29, 2014, 13 pages.

Ran Fang et al: "A high-voltage interface circuit for MEMS vibratory gyroscope", Electron Devices and Solid State Circuit (EDSSC), 2012 IEEE International Conference on, IEEE, Dec. 3, 2012 (Dec. 3, 2012), 2 pages.

GB Search Report for Application No. 1311967.2, dated Sep. 17, 2013, 4 pages.

Alan Evans, "Cavity packages for volume MEMS applications", 35th IEEE/CPMT International Electronic Manufacturing Technology Symposium (IEMT), Jun. 11, 2012, p. 1-24.

Cheng-Hsiang Liu et al. "Novel approaches of wafer level packaging for MEMS devices", Proceedings of the 62nd IEEE Electornic Components and Tehnology Conference (ECTC), May 29, 2012, pp. 1260-1266.

GB Search Report for Application No. 1311967.2 dated Feb. 15, 2017, 5 pages.

* cited by examiner

PICKOFF TRANSDUCER WIRE BOND BIT DETECTION

CROSS REFERENCE TO RELATED APPLICATIONS

This is a US National Stage of Application No. PCT/EP2014/064239, filed on Jul. 3, 2014, which claims the benefit of GB Application No. 1311967.2 filed Jul. 4, 2013, the disclosures of which are incorporated herein by reference.

TECHNICAL FIELD

The present invention is concerned with circuitry for reliably detecting faults in a sensor, particularly detecting failure or breakage of bond wires connecting components of the sensor.

BACKGROUND

An electronic sensor usually includes one or more transducers connected, to control circuitry, which may be provided separately, e.g. as an ASIC. A sensor will usually include several transducers connected together again by bond wires, as e.g. a MEMS. Examples of applications for such sensors include vehicle navigation systems; handheld navigation systems, vehicle ESP (electronic stability control systems); vehicle airbag deployment; model helicopter stabilisation; agricultural spray boom stabilisation; satellite receiver stabilisation; UAV navigation and stability systems; and light aircraft secondary instrumentation. Some of these applications have more stringent requirements on fault detection than others.

Sensors can provide unreliable results if a bond wire between transducers, or between a transducer and the control circuit, breaks or is damaged. A wire bond failure can result in a sensor output that is plausible—i.e. appears to be within a specified operating range, but which is, in fact, erroneous.

For example, a sensor comprising four sense transducers connected to an amplifier would, if one transducer was lost due to e.g. a lead failure, have its output signal reduced by ¼ (25%). It is possible, however, for the output signal to vary under normal operation, by up to 32% over temperature and tolerances. It is difficult, therefore, to determine whether a reduction in output signal is indicative of loss of a transducer or just due to normal fluctuations.

Devices and techniques have been proposed to increase the accuracy and reliability of sensors but typically require additional complexity, including the injection of trace signals with demodulation techniques to reject the trace signal from the normal required signal and measurement of the trace signal to allow fault detection increasing circuit complexity, injection of trace signals under the command of the host system but does not provide continuous fault detection and is subject to periods of the signal being invalid during the applied test, failure detection circuits with a threshold limit that is adjusted with temperature to compensate for the variation of the normal level over temperature increasing circuit complexity and requiring knowledge of temperature variation and the use of additional transducers on the MEMS to allow comparison of the signal against a reference signal increasing the complexity of the MEMS and reducing the allowable area for the detection transducers therefore reducing sensor performance through degraded signal to noise ratios and sensitivities.

SUMMARY

The present invention provides a sensor device comprising:
 at least two transducers;
 a sensor signal processing circuit;
 transducer to sensor signal processing circuit electrical connections, each connecting a respective one of the transducers to the sensor signal processing circuit;
 a differential amplifier connected with two bond wires, the bond wires connected to the differential inputs of the differential amplifier and the amplifier output connected to the sensor signal processing circuit.

The electrical connections, in the described embodiments, are wire bonds, but can consist of other forms e.g. flip chip solder bumps.

Whilst the use of a differential amplifier provides advantages over the prior art, sensing accuracy may be further increased in a system comprising at least two pairs of transducers, whereby each pair of transducers is connected to the differential amplifier by a single bond wire.

Ability to detect faults may be increased further by using high capacitance value components for the transducers as compared to values commonly used.

BRIEF DESCRIPTION OF THE DRAWINGS

Embodiments will be described, by way of example only, with reference to the drawings, wherein.

DETAILED DESCRIPTION

Figure 1:
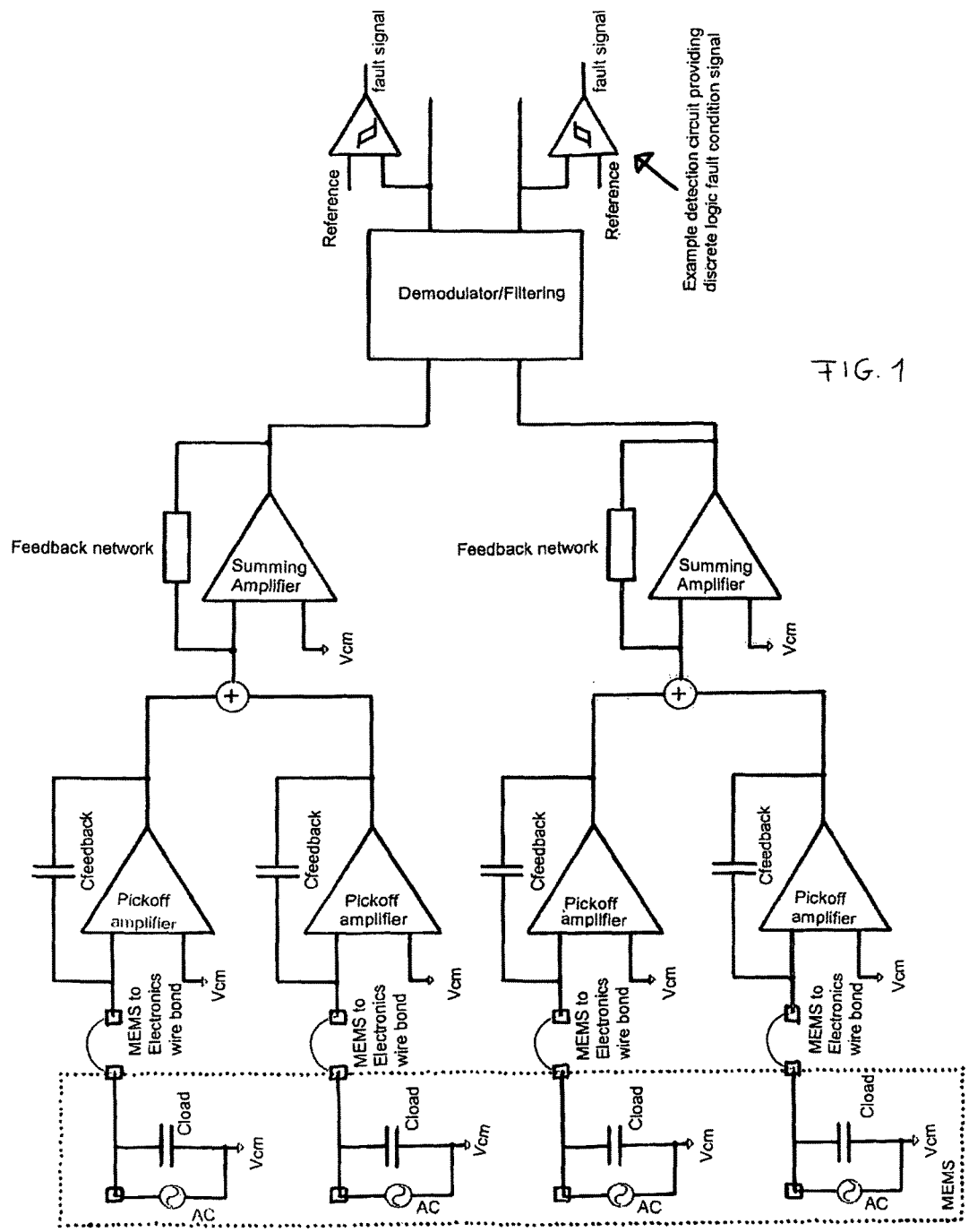
FIG. 1 shows a prior art architecture.

FIG. 1 below shows a prior art architecture where the pickoff transducers are each connected to separate inverting (or non-inverting) amplifiers before being combined to provide a differential signal.

In this architecture the loss of a single wire bond would only result in a reduction of the signal by 25% which is less than the variation that occurs over temperature, as described further below.

Also, in the case where the individual transducers have only a small amount of capacitance, even if they are connected to a differential amplifier, the loss of one transducer (hub wire bond) would result in a smaller gain loss as the change in capacitance is proportionally smaller when stray capacitances from wire bonds and tracking are taken into account, which when combined with the loss of the single transducer does not create enough signal change to exceed the normal variation over temperature.

In these cases it would require the disconnection of more than one transducer to achieve a level sufficient to detect above the normal variation across temperature.

Figure 2:
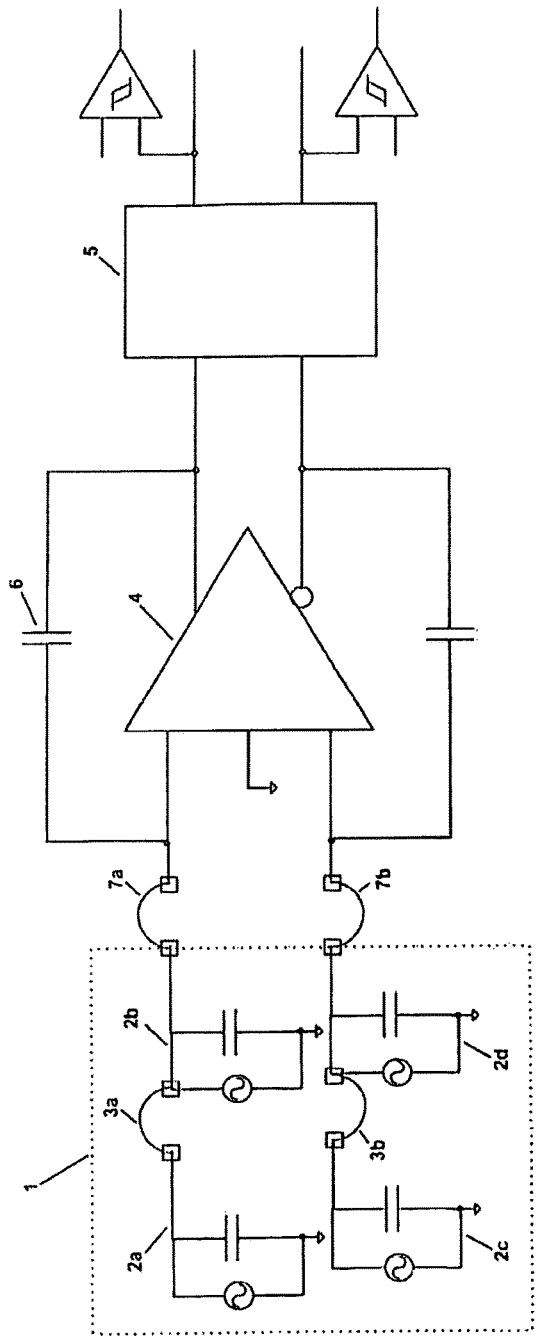
FIG. 2 shows a circuit diagram of the present system.
Figure 2:
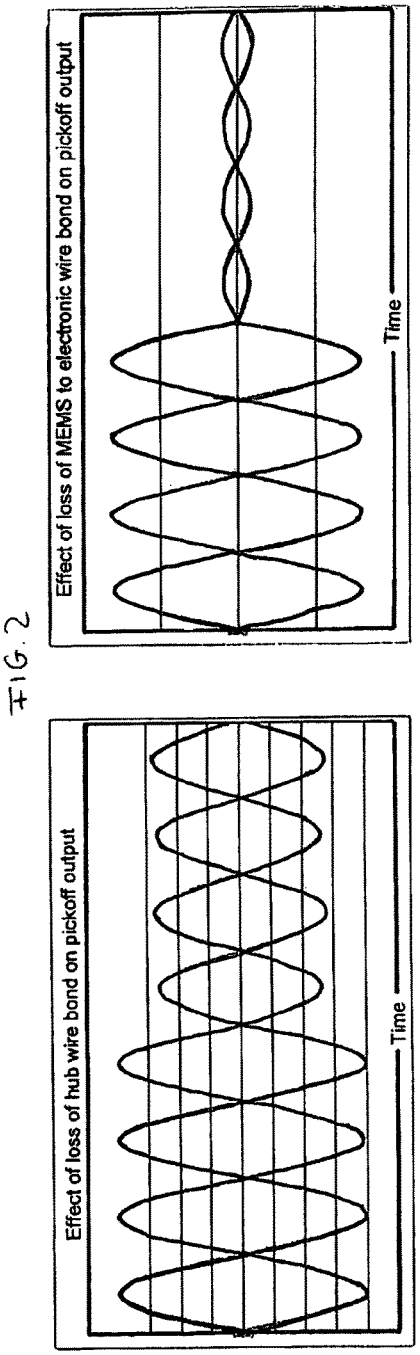

A preferred embodiment of the improved system is shown in the circuit diagram of FIG. 2.

The sensor is provided as a MEMS 1 having, in this example, four transducers 2a, 2b, 2c, 2d. These may be of any known type, e.g. piezoelectric transducers, PZT devices or capacitive. Of course fewer, or more, transducers may be used. In the embodiment shown, the sensor has transducers connected in pairs.

As shown in the circuit diagram, each transducer provides an AC output signal, shown as an AC source, and has a load capacitance. The transducers on the MEMS are, in the shown embodiment, connected in pairs, with the two transducers of each pair connected to each other by means of a hub wire bond 3a, 3b.

Figure 3:
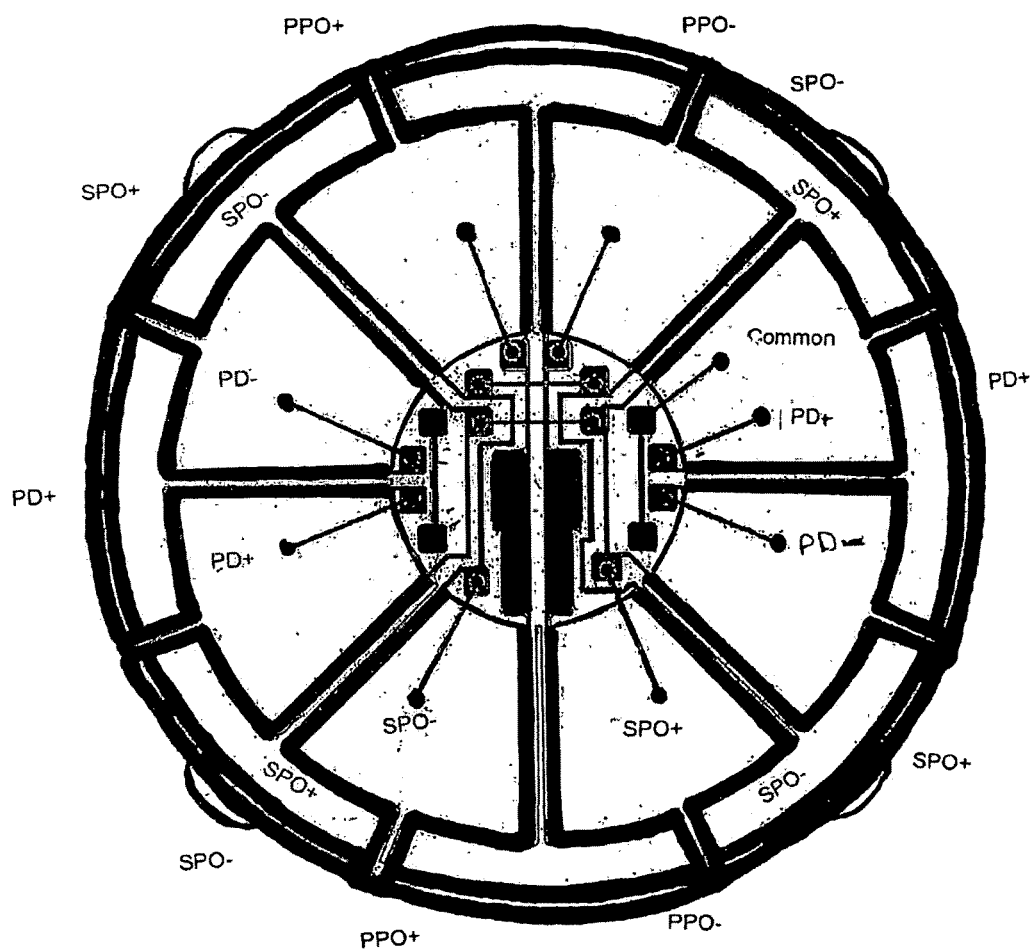
FIG. 3 shows an example of a MEMS transducer configuration.

The transducers may be positioned on either side of a neutral axis of a ring structure as shown in FIG. 3, and at 90° angles around the ring structure. This provides four transducers (SPO+) of one phase and four transducers (SPO−) of the opposite phase to give the differential output. Due to the positioning on the ring, pairs of transducers are connected with normal patterning of the metal and PZT via the hub part of the ring. This construction therefore only requires one wire bond on the hub to connect together the four transducers of one phase and one wire bond on the hub to connect together the four transducers of the other phase. It then subsequently only requires a single wire bond per phase to connect the MEMS to the electronics. FIG. 3 below shows a diagrammatic representation of the MEMS structure.

The MEMS provides a sensor output which is connected to the electronics, typically consisting of a pickoff amplifier 4 followed by a demodulator and filter circuit 5 in a separate circuit, for example on an ASIC. The demodulated and filtered signals are then subjected to logic fault condition processing to provide discrete logic fault signals.

If a failure occurs in one of the hub wire bonds 3a, 3b connecting the transducers with each pair, in the present example with four transducers, this will result in a loss of one quarter of the output signal from the MEMS—i.e. 25%.

In order to overcome the problems with the prior art systems, and to increase the accuracy of fault detection, this reduction is amplified by means of a differential pickoff amplifier 4 connected between the MEMS 1 and the demodulation/filtering circuit 5.

The differential amplifier or 'pickoff' amplifier is configured as a charge amplifier having differential inputs and two outputs which are then connected back to the differential inputs via a capacitive connection Cfeedback 6.

The outputs of each pair of transducers on the MEMS are connected to a respective input of the differential amplifier, again by means of a wire bond 7a, 7b.

If the hub wire bonds connecting the respective transducers in pairs are intact, and the output signal from the MEMS is a complete signal, problems can still arise if one of the wire bonds connecting the MEMS to the output circuitry is damaged. In the present case, with two pairs of transducers, and two wire bonds, if one of these wires is damaged, this results in a loss of half of the MEMS output signal.

The gain of the differential amplifier stage is set by the feedback capacitor ($C_{feedback}$) and the load capacitance of the transducers ($C_{load}$). As the circuit operates in a differential mode, the gain is defined by both feedback capacitors and the load capacitors, according to the equation $$\text{Gain} = \frac{-(Feedback capacitor)}{Load Capacitance} \text{ i.e. Gain} = \frac{-(Cfeedback)}{Cload}$$

With such an amplifier stage, the loss of a single transducer, due to, in particular, damage to one of the hub wire bonds, would, in the case of four transducers, result in the disconnection of a quarter (25%) of the normal pickoff transducer capacitance $C_{load}$. According to this equation, the change in the load capacitance causes the gain of the pickoff amplifier to alter to 68% of the original gain. This gain change would combine with the loss of a quarter of the normal pickoff signal to reduce the overall pickoff signal gain to (0.75×0.68)×100=51% of the original level.

In addition, as mentioned above, the configuration is such that there are only two wire bonds 7a, 7b connecting the MEMS transducers to the differential amplifier. This creates a condition wherein a faulty wire bond connection between the MEMS and the output circuitry would result in the loss of 50% of the signal from the MEMS transducers and, therefore, loss of half (50%) of the pickoff transducer capacitance ($C_{load}$).

The change in the load capacitance causes the gain of the amplifier to reduce to 11% of the original gain. This gain change would combine with the loss of half of the normal pickoff signal, to reduce the overall pickoff signal gain to (0.5×0.11)×100=5.5% of the original level.

To further improve accuracy of detection, the capacitors should have a relatively high value. For example, the capacitance of each pair of transducers may be in the range of 80 pF to 250 pF. The hub wire bond connects together two pairs of transducers therefore the transducer capacitance on each side of the differential amplifier may be in the range of 160 pF to 500 pF.

Previous sensors of a similar architecture have a transducer capacitance in the range of 0.1 pF to 2 pF. Therefore a pair of transducers would have a capacitance in the range of 0.2 pF to 4 pF. If connected in a similar manner then the transducer capacitance on each side of the differential amplifier would be in the range of 0.4 pF to 8 pF. The higher capacitance therefore greatly improves detection. Advantages can, however, still be obtained using more usual capacitance values.

These changes can be detected using a suitable detection circuit (conventionally available circuits are known and this part of the system is not described further) after the pickoff amplifier. The example shown describes a demodulation and filtration stage, but other processing stages and detection circuitry can be used.

Other points within the circuit can be used to detect the change in gain, as deemed most suitable.

The invention claimed is:

1. A sensor device comprising:
   two pairs of transducers, wherein transducers in each pair are connected to each other in series by a hub wire bond, the in each pair together having a load capacitance $C_{load}$ when connected by the hub wire bond;
   a sensor signal processing circuit;
   a differential amplifier having differential inputs and two outputs, wherein the output of each respective pair of transducers is connected to a respective one of the differential inputs of the differential amplifier by a respective single bond wire, the two outputs connected to the sensor signal processing circuit, wherein each amplifier output is connected back to a respective one of the differential inputs via a capacitive connection $C_{feedback}$;
   wherein if a hub wire bond breaks, the load capacitance $C_{load}$ is that of the transducer connected to the differential inputs
   wherein the gain of the differential amplifier Gain is defined by the equation:

$\text{Gain} = -C_{feedback}/C_{load}$.

* * * * *